United States Patent
Staudemeyer et al.

(10) Patent No.: US 6,612,757 B1
(45) Date of Patent: Sep. 2, 2003

(54) MULTICHANNEL OPTICAL TRANSMITTER

(75) Inventors: Nhu-Phuong Staudemeyer, Berlin (DE); Volker Plickert, Brieslang (DE); Lutz Melchior, Berlin (DE)

(73) Assignee: Infineon Technologies AG, Munich (DE)

( * ) Notice: Subject to any disclaimer, the term of this patent is extended or adjusted under 35 U.S.C. 154(b) by 0 days.

(21) Appl. No.: 09/555,450

(22) PCT Filed: Nov. 26, 1997

(86) PCT No.: PCT/DE98/03550
§ 371 (c)(1),
(2), (4) Date: Feb. 27, 2001

(87) PCT Pub. No.: WO99/29000
PCT Pub. Date: Jun. 10, 1999

(30) Foreign Application Priority Data

Nov. 28, 1997 (DE) .......................... 197 54 770

(51) Int. Cl.⁷ .......................... H04B 10/04; H04B 10/08
(52) U.S. Cl. .......................... 398/182; 398/195; 398/23
(58) Field of Search .............................. 359/180, 110, 359/187; 257/444, 84, 79; 372/29.01, 29.02, 31, 50

(56) References Cited

U.S. PATENT DOCUMENTS

| 4,766,471 A | * | 8/1988 | Ovshinsky et al. ........... 257/53 |
| 4,847,848 A | | 7/1989 | Inoue et al. |
| 5,757,829 A | | 5/1998 | Jiang et al. |
| 5,784,396 A | | 7/1998 | Guerin |
| 5,799,030 A | * | 8/1998 | Brenner ........................ 372/50 |
| 6,037,644 A | * | 3/2000 | Daghighian et al. ........ 257/444 |

FOREIGN PATENT DOCUMENTS

| DE | 43 13 492 C1 | 7/1994 |
| DE | 196 01 955 A1 | 7/1997 |
| DE | 196 50 853 A1 | 7/1997 |
| EP | 0 622 874 A1 | 11/1994 |

* cited by examiner

*Primary Examiner*—Jason Chan
*Assistant Examiner*—D. Payne
(74) *Attorney, Agent, or Firm*—Laurence A. Greenberg; Werner H. Stemer; Ralph E. Locher

(57) ABSTRACT

The transmission device comprises a transmission unit (1) having a plurality of useful lasers (3b to 3m), which are arranged in a row (2) and emit useful radiation vertically with respect to the covering area (1b) of the transmission unit. In order to regulate the useful radiation power, a monitor receiver (20a) is arranged on a mounting plane (26a) which is laterally adjacent to the transmission unit (1) and lies above the covering area (1b). The monitor receiver projects above an assigned monitoring laser (3a) like a cantilever support in such a way that its radiation-sensitive area (23a) is opposite the optically active zone (4a) of the monitoring laser (3a).

12 Claims, 5 Drawing Sheets

MULTICHANNEL OPTICAL TRANSMISSION DEVICE

MULTICHANNEL OPTICAL TRANSMISSION DEVICE

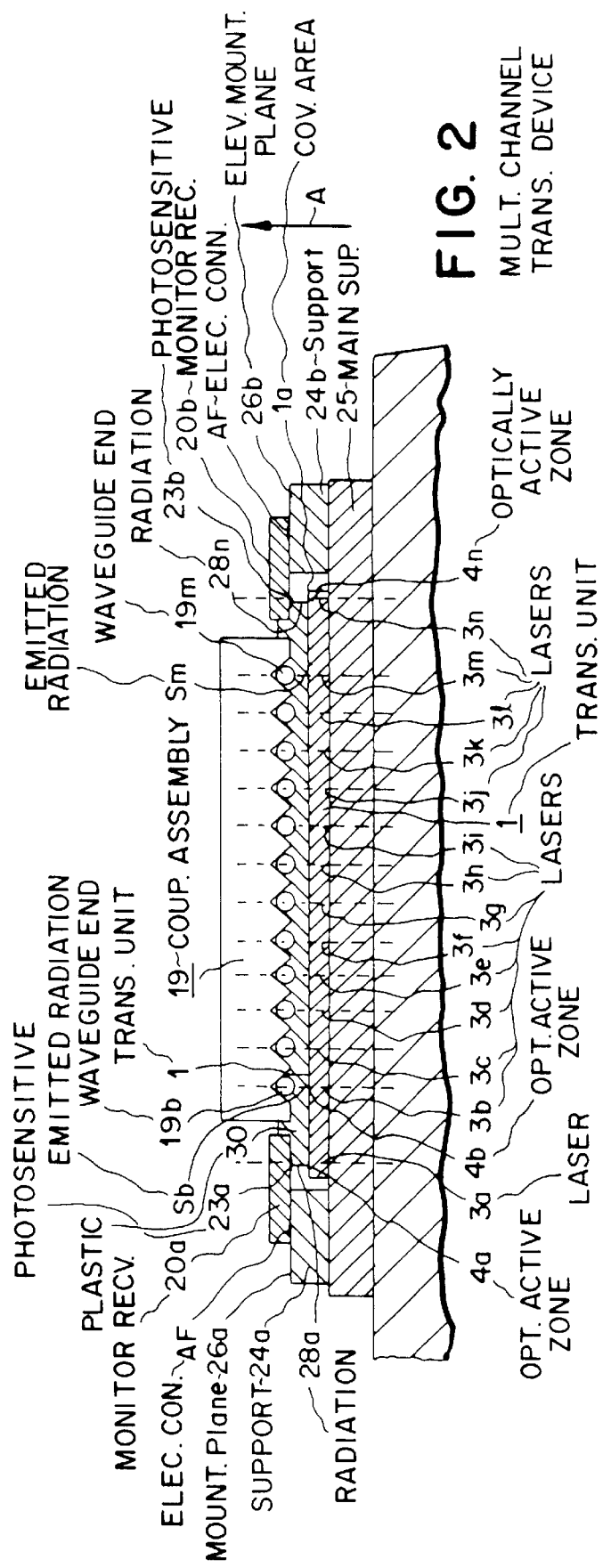

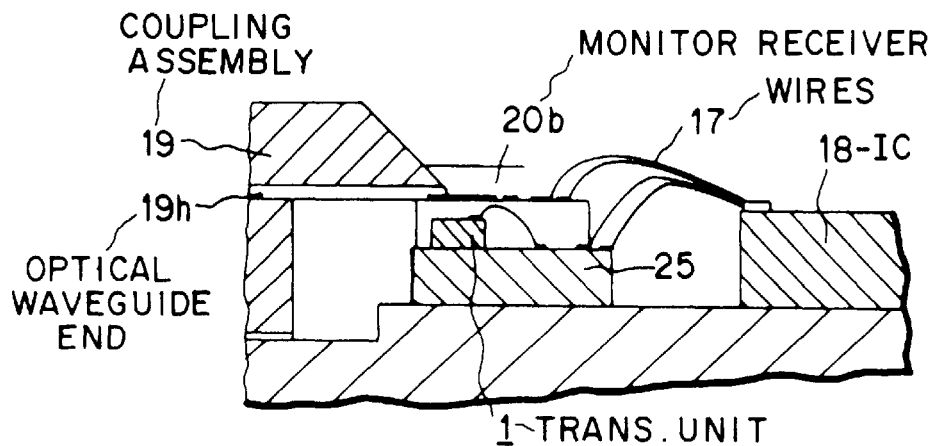
FIG. 3 MULTICHANNEL OPTICAL TRANSMISSION
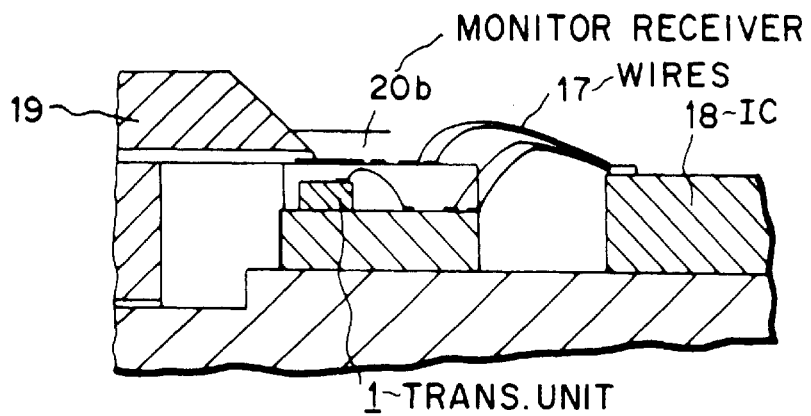
FIG. 6 VARIANT TRANS. DEVICE

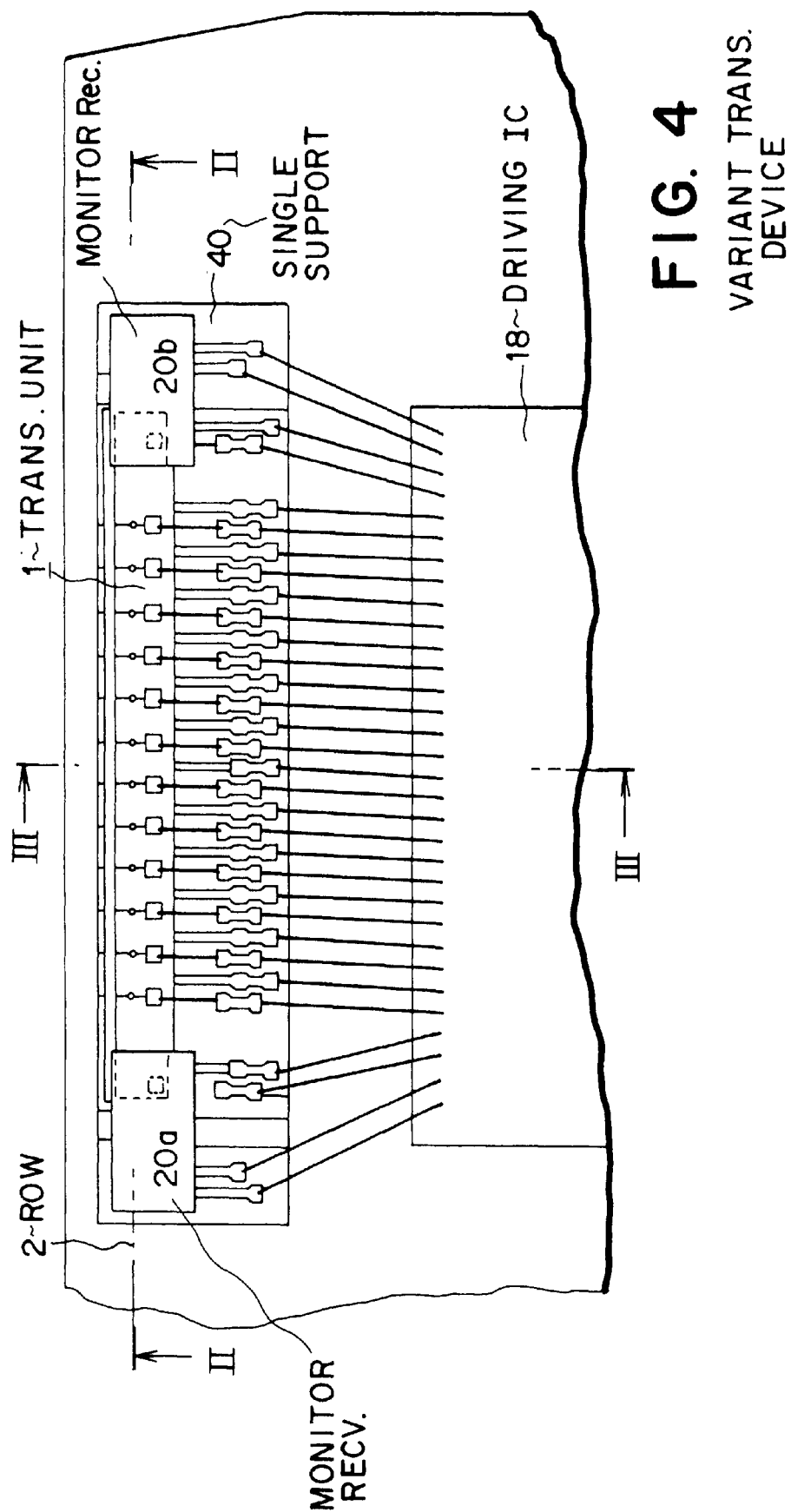
FIG. 4 VARIANT TRANS. DEVICE

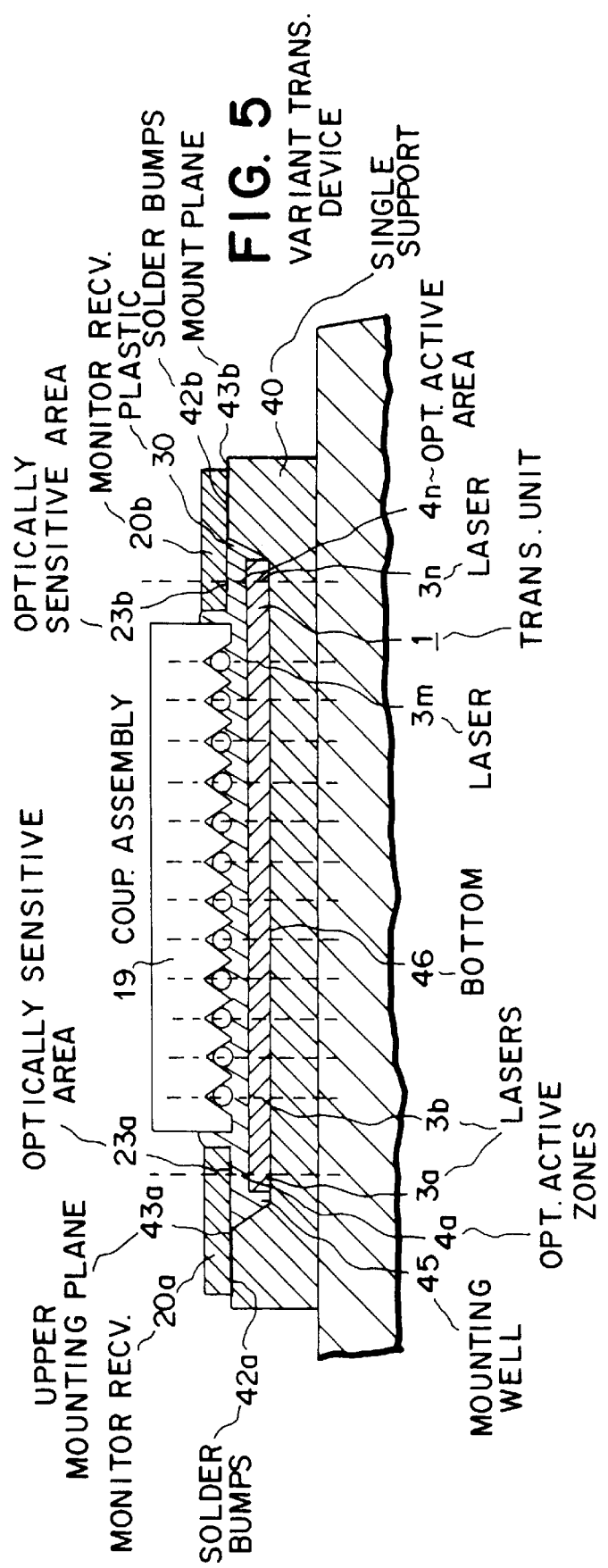

MULTICHANNEL OPTICAL TRANSMITTER

BACKGROUND OF THE INVENTION

Field of the Invention

The invention is in the field of multichannel optical transmission devices, in particular for parallel multichannel data transmission by means of a corresponding plurality of optical waveguides, and relates to a transmission device having a transmission unit comprising a plurality of useful lasers arranged in a row, where the optically active zones of the useful lasers, when driven, emit useful radiation vertically with respect to the covering area of the transmission unit, and having a monitor unit for monitoring, which comprises at least one monitoring laser arranged on the row of useful lasers, the optically active zone of which monitoring laser, when driven, emits radiation vertically with respect to the same covering area of the transmission unit, which radiation at least partly passes to a radiation-sensitive area of a monitor receiver.

It is known (EP 0622874 A1) in connection with laser transmitters that the optical power radiated by the laser is subject in particular to temperature- and aging-dependent fluctuations. With regard to laser safety, moreover, it must be ensured that laser light emerging from an externally accessible optical interface (so-called optical port) remains below a power limit value. In the event of an impermissible increase in the laser power above said limit value, for example owing to a fault in the electronic drive circuit, the laser must be reliably switched off. For the purposes mentioned above, regulating devices are customary which readjust the driving of the laser in order to obtain a constant output power lying below permissible limit values. To that end, the optical power must be monitored. To that end, EP 0622874 A1 discloses regulation of the temperature- and aging-dependent optical power of an edge-emitting laser to whose rear radiation region a monitoring or monitor diode is coupled. The coupling is effected by means of a depression which is arranged in a common support and at which the radiation emitted at the rear passes via at least one reflecting surface onto the optically sensitive zone of the monitor diode. This known design is unsuitable, however, for monitoring and regulating laser devices which radiate vertically with respect to the covering area (so-called VCSEL).

The international patent application WO 97/25638 discloses a multichannel optical transmission device of the type mentioned in the introduction whose transmission unit is formed by a laser array containing a plurality of individually driveable useful lasers arranged in a row. The optically active zones of the useful lasers are designed in such a way that their useful radiation emerges vertically with respect to the covering area. The emitted radiation of the first semiconductor laser in the row is not, by contrast, used as useful radiation but rather serves for regulating the drive current of all the semiconductor lasers. This first single laser thus functions as a monitoring laser; the radiation thereof passes through a depression on that side of a base body which faces the laser array, by multiple reflection, onto the radiation-sensitive area of a monitor receiver arranged next to the laser array. The monitor receiver is arranged essentially on the same plane as the laser array.

This known transmission device allows reliable regulation of the laser output powers, but the multiple deflection of the radiation of the monitoring laser and the mounting can prove to be problematic. In cases where complete potting of the transmission device is desirable, there is the risk of air inclusions forming at the deflection mirrors, which air inclusions reduce the coupling efficiency. Overall, only a comparatively small proportion of the radiation emitted at the monitoring laser is available for regulation purposes.

SUMMARY OF THE INVENTION

The object of the invention consists, therefore, in developing a transmission device to the effect that a comparatively high coupling efficiency between the monitoring laser and the monitor receiver is ensured in conjunction with a design of the transmission device which is simple and facilitates production.

In the case of a transmission device of.the type mentioned in the introduction, this object is achieved according to the invention by virtue of the fact that the monitor receiver is arranged on a plane lying above the covering area of the transmission unit, and that the monitor receiver projects above the monitoring laser like a cantilever support in such a way that its radiation-sensitive area is opposite the optically active zone of the monitoring laser.

The monitoring laser should have to the greatest possible extent identical electro optical properties, in particular with regard to the temperature response and aging behavior, to those of the useful lasers. This can advantageously be achieved in a particularly simple manner by virtue of the fact that the monitoring laser is part of the transmission unit. In other words, a transmission unit (preferably a laser array) is used in which not all of the activatable individual lasers are used as useful lasers, rather at least one of the lasers serves as a monitoring laser.

A significant advantage of the invention is that it is possible to reliably regulate the transmission device with comparatively few components, which are simple to produce and mount. The monitor receiver arrangement may advantageously be mounted independently of the transmission unit and initially tested. A further considerable advantage of the transmission device according to the invention is that virtually hundred percent overcoupling of the monitoring laser power to the monitor receiver is possible. Highly effective regulation of the transmission device can be achieved as a result. An advantageous aspect of the invention is that the optically active zone of the monitoring laser has situated opposite it a radiation-sensitive area of the monitor receiver, which area is comparatively large in relation to said zone; this allows comparatively large positional tolerances with regard to the monitor mounting. Finally, the transmission device according to the invention manages without additional optical imaging or reflecting elements in the optical coupling between monitoring laser and monitor receiver, which contributes to a considerable reduction of the production outlay.

A refinement of the transmission device according to the invention which is preferred in terms of production engineering provides for electrical connections of the monitor receiver to lie on the same side as the radiation-sensitive area.

This makes it possible to mount and to make contact with the monitor receiver using so-called flip-chip technology, in which case it is advantageously possible to utilize self-centering effects by means of solder bumps previously applied to corresponding contact areas.

In order to protect the transmission device against ambient influences, an advantageous development of the invention provides for the space between the optically active zone of the monitoring laser and the radiation-sensitive area of the monitor receiver to be filled with a plastic which is transmissive to the emitted radiation.

A further reduction of the individual parts required for the transmission device according to the invention can be achieved, according to an advantageous development of the invention, by virtue of the fact that the transmission unit is arranged on a lower mounting plane and the monitor receiver is arranged on a laterally superior mounting plane of a common support. The support has mounting areas at different heights, contact being made with the monitor receiver on the mounting area at the higher level preferably using flip-chip technology, with utilization of the self-alignment effect in the course of solder bump mounting. Particularly reliable regulation using balanced regulating input signals can be achieved, according to a preferred refinement of the invention, by virtue of the fact that adjoining the row of useful lasers there is arranged in each case a monitor unit with a monitoring laser and a monitor receiver whose radiation-sensitive area faces the optically active zone of the respective monitoring laser.

Exemplary embodiments of a transmission device according to the invention are explained below with reference to the drawings.

BRIEF DESCRIPTION OF THE DRAWINGS

FIGS. 1, 2 and 3 show a first transmission device in partial plan view, in longitudinal section along the line II—II and in cross section along the line III—III; and FIGS. 4 to 6 show a second exemplary embodiment in the same plan-view and sectional illustrations.

DESCRIPTION OF THE PREFERRED EMBODIMENT

Figure 1:
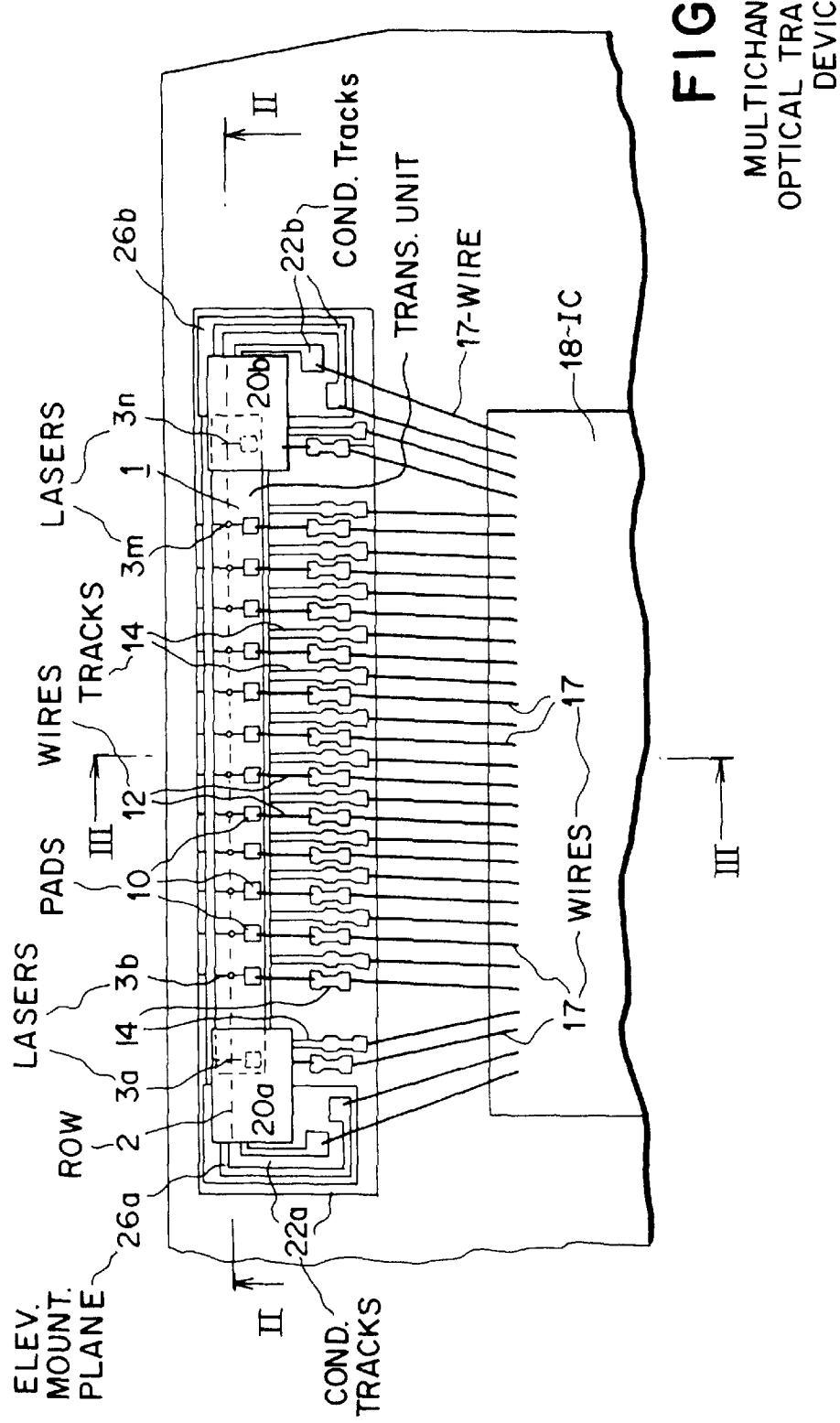

In accordance with FIGS. 1 to 3, the multichannel optical transmission device contains a transmission unit 1, which is designed as a laser array and comprises a plurality of individual semiconductor lasers 3a to 3n arranged in a row 2.

The lasers are produced using integral construction technology in a manner known per se and each have an optically active zone 4a, 4b and correspondingly through to 4n. The optically active zones 4a to 4n are formed in an upper covering layer 1a of the transmission unit 1 and, when driven electrically, emit useful radiation in the vertical direction A (FIG. 2) upward from a covering area 1b. The individual lasers are driven in a manner known per se via connection pads 10 formed on the covering area 1b of the transmission unit 1 and via conductor tracks 14 with further connection pads 16, said conductor tracks making contact with said connection pads 10 via bonding wires 12. Connected to the further connection pads are, on the one hand, the bonding wires 12 and, on the other hand, further bonding wires 17, which form bonding bridges to a regulating and driving IC 18, which is only hinted at in the illustration.

The semiconductor lasers 3b to 3m are arranged in such a way with regard to optical waveguide ends 19b to 19m of a coupling assembly 19 that radiation Sb to Sm emitted by them enters the optical waveguide ends. Therefore, this radiation is also designated below as useful radiation and the corresponding lasers 3b to 3m as useful lasers. By modulating the emitted radiation, it is possible to generate optical signals and feed them for forwarding into the ends of the optical waveguides 19b to 19m.

In order to regulate the useful radiation power of the lasers 3b to 3m, the transmission device is provided with an (electronic regulating arrangement (not illustrated) which is known per se and is integrated in the circuit 18. Output signals supplied by two monitor receivers 20a, 20b and fed to the circuit 18 via conductor tracks 22a, 22b and bonding wires serve as input variable for said regulating arrangement. The output signals are related to the radiation intensity or radiation power which impinges on an optically sensitive area 23a, 23b of the monitor receivers 20a, 20b. The monitor receiver 20a, 20b is in each case contact-connected and fixed on a separate support 24a, 24b using flip-chip mounting technology. In this case, corresponding connection pads AF on the underside of the monitor receivers and of the respective support 24a, 24b interact, with the interposition of solder balls (solder bumps). When the solder is reheated, the solder balls make contact with the connection pads of both components and thereby result in self-alignment of the monitor receivers 20a20b with regard to the respective support. The photosensitive areas 23a, 23b are also formed on the same underside of the monitor receivers. The supports 24a, 24b are fixed on a main support 25, which is also a support of the transmission unit 1.

As is clearly shown by FIG. 2, in particular, each monitor receiver is arranged on an elevated mounting plane 26a, 26b, formed laterally with respect to the transmission unit 1, as a cantilever support in such a way that the radiation-sensitive area 23a, 23b is opposite the optically active zone 4a, 4n of the lasers 3a, 3n, an interspace being formed. The monitor receiver fitted on the respective support can thus be mounted independently of the transmission unit and also be individually tested on account of its independent contact-making. The lasers 3a, 3n arranged at both ends of the row 2 thus do not function as useful lasers but rather as monitoring lasers whose emitted radiation impinges on the respective assigned monitor receiver and thus serves for regulating the optical output power of the entire transmission device. The configuration of the monitor receiver assemblies additionally affords the advantage that the radiation course between the active zone 4a, 4n and the assigned radiation-sensitive area 23a, 23b is implemented directly and rectilinearly without the interposition of additional optically imaging and/or reflecting elements in a comparatively short path. Since, moreover, the radiation-sensitive area is designed to be relatively large in comparison with the optically active zones, the result is a relatively large positional tolerance of the monitor receiver relative to the respective monitoring laser. Overall, this produces a high coupling efficiency and hence highly efficient regulation of the laser output powers. For protection purposes, the space between the respective optically active zone 4a, 4n and the radiation-sensitive area 23a, 23b is filled with a plastic 30 which is transmissive to the emitted radiation 28a, 28n of the lasers 4a, 4n.

FIGS. 4 to 6 show a variant of the transmission device which, in terms of its basic design and in terms of its optical and electrical connection, corresponds to the device shown in FIGS. 1 to 3. Therefore, the same reference symbols are also used for the same elements. The variant consists essentially in the fact that a single support 40 is provided, which carries both the transmission unit 1 with its individual lasers 3a to 3n and the respective monitor receiver 20a, 20b. The monitor receivers are mounted, using above-described flip-chip mounting technology, by means of solder bumps 42a, 42b directly on an upper mounting plane 43a, 43b of the support 40. The support is preferably composed of anisotropically etched silicon in the <100> orientation and has an etched mounting well 45. The transmission unit 1 lies on the bottom 46 of the mounting well. In a further production engineering simplification and reduction of the structural parts required, this construction likewise makes it possible to mount the monitor receivers 20a, 20b in such a way that the radiation-sensitive areas 23a, 23b are oriented to the optically active zones 4a, 4n of the monitoring lasers 3a, 3n and the monitor receivers project above the respective monitoring laser like a cantilever support.

What is claimed is:

1. A multichannel optical transmission device, comprising:
   a transmission unit having:
      a covering area; and
      useful lasers with optically active zones, said useful lasers disposed in a row, said optically active zones emitting useful radiation vertically with respect to said covering area when said useful lasers are driven; and
   a monitor unit having:
      a monitor receiver with a radiation-sensitive area, said monitor receiver disposed on a plane lying above said covering area;
      at least one monitoring laser with an optically active monitoring zone, said at least one monitoring laser disposed at said row of useful lasers, said optically active monitoring zone emitting radiation perpendicular to said covering area, at least a part of said radiation passing to said radiation-sensitive area when said at least one monitoring laser is driven;
      said monitor receiver projecting above said at least one monitoring laser as a cantilever support to place said radiation-sensitive area opposite said optically active monitoring zone;
      said optically active monitoring zone and said radiation-sensitive area defining a space therebetween; and
      a plastic transmissive to said radiation filling said space.

2. The transmission device according to claim 1 wherein:
   said monitor receiver has a side and electrical connections, and said radiation-sensitive area; and
   said electrical connections are disposed on said side.

3. The transmission device according to claim 1, including a support having a lower mounting plane and a laterally superior mounting plane, said transmission unit disposed on said lower mounting plane, said monitor receiver disposed on said laterally superior mounting plane.

4. The transmission device according to claim 1, wherein said row has an end and said monitor unit is disposed at said end.

5. The transmission device according to claim 1, wherein said row has an end and said monitor unit is disposed adjacent said end in said row.

6. The transmission device according to claim 1, wherein:
   said row has two ends;
   said monitor unit is two monitor units each disposed adjacent a respective one of said ends in said row; and
   said radiation-sensitive area of a respective monitor receiver faces said optically active monitoring zone of a respective monitoring laser.

7. A multichannel optical transmission device, comprising:
   a transmission unit having:
      a covering area; and
      useful lasers with optically active zones, said useful lasers disposed in a row, said optically active zones emitting useful radiation vertically with respect to said covering area when said useful lasers are driven; and
   a monitor unit having:
      a monitor receiver with a radiation-sensitive area, said monitor receiver disposed on a plane lying above said covering area;
      at least one monitoring laser with an optically active monitoring zone, said at least one monitoring laser disposed at said row of useful lasers, said optically active monitoring zone emitting radiation perpendicular to said covering area, at least a part of said radiation passing to said radiation-sensitive area when said at least one monitoring laser is driven;
      said monitor receiver projecting above said at least one monitoring laser as a cantilever support to place said radiation-sensitive area opposite said optically active monitoring zone;
      said optically active monitoring zone and said radiation-sensitive area defining a space therebetween; and
      a plastic substantially transparent to said radiation filling said space.

8. The transmission device according to claim 7, wherein:
   said monitor receiver has a side and electrical connections, and said radiation-sensitive area; and
   said electrical connections are disposed on said side.

9. The transmission device according to claim 7, including a support having a lower mounting plane and a laterally superior mounting plane, said transmission unit disposed on said lower mounting plane, said monitor receiver disposed on said laterally superior mounting plane.

10. The transmission device according to claim 7, wherein said row has an end and said monitor unit is disposed at said end.

11. The transmission device according to claim 7, wherein said row has an end and said monitor unit is disposed adjacent said end in said row.

12. The transmission device according to claim 7, wherein:
   said row has two ends;
   said monitor unit is two monitor units each disposed adjacent a respective one of said ends in said row; and
   said radiation-sensitive area of a respective monitor receiver faces said optically active monitoring zone of a respective monitoring laser.

* * * * *

UNITED STATES PATENT AND TRADEMARK OFFICE
CERTIFICATE OF CORRECTION

PATENT NO. : 6,612,757 B1
DATED : September 2, 2003
INVENTOR(S) : Nhu-Phuong Staudemeyer et al.

It is certified that error appears in the above-identified patent and that said Letters Patent is hereby corrected as shown below:

<u>Title page,</u>
Item [22], should read as follows:

-- PCT Filed: Nov. 26, 1998 --

Signed and Sealed this

Sixteenth Day of December, 2003

JAMES E. ROGAN
*Director of the United States Patent and Trademark Office*